(12) United States Patent
Nawata et al.

(10) Patent No.: US 10,209,633 B2
(45) Date of Patent: Feb. 19, 2019

(54) VIBRATION CONTROL APPARATUS, LITHOGRAPHY APPARATUS, AND METHOD OF MANUFACTURING ARTICLE

(71) Applicant: CANON KABUSHIKI KAISHA, Tokyo (JP)

(72) Inventors: Ryo Nawata, Utsunomiya (JP); Kenji Noda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 21 days.

(21) Appl. No.: 15/277,103

(22) Filed: Sep. 27, 2016

(65) Prior Publication Data

US 2017/0102626 A1    Apr. 13, 2017

(30) Foreign Application Priority Data

Oct. 8, 2015 (JP) ................................. 2015-200471

(51) Int. Cl.
*G03F 7/20* (2006.01)
*H02P 25/032* (2016.01)

(52) U.S. Cl.
CPC .......... *G03F 7/70808* (2013.01); *G03F 7/709* (2013.01); *G03F 7/70833* (2013.01); *H02P 25/032* (2016.02)

(58) Field of Classification Search
CPC .... G03F 7/70808; G03F 7/709; G03F 7/0002; G03F 7/70716; G03F 7/70725; G03F 7/70833; H02P 25/032; H01L 21/0274
See application file for complete search history.

(56) References Cited

U.S. PATENT DOCUMENTS

| | | | | | |
|---|---|---|---|---|---|
| 5,030,901 A | * | 7/1991 | Futami | ................. | G05B 19/237 |
| | | | | | 318/594 |
| 5,653,317 A | * | 8/1997 | Wakui | ..................... | F16F 15/02 |
| | | | | | 188/378 |
| 5,900,707 A | * | 5/1999 | Wakui | ................. | G03F 7/70358 |
| | | | | | 318/560 |
| 6,021,991 A | * | 2/2000 | Mayama | ................. | F16F 15/02 |
| | | | | | 188/267 |

(Continued)

FOREIGN PATENT DOCUMENTS

| | | |
|---|---|---|
| CN | 1601386 A | 3/2005 |
| CN | 103032513 A | 4/2013 |
| JP | 2003021190 A | 1/2003 |

OTHER PUBLICATIONS

Office Action issued in Chinese Appln. No. 201610877931.9 dated Aug. 30, 2018. English Translation provided.

*Primary Examiner* — Deoram Persaud
(74) *Attorney, Agent, or Firm* — Rossi, Kimms & McDowell LLP

(57) ABSTRACT

The present invention provides a vibration control apparatus which controls vibration of an object supported via a support having a damping coefficient, the apparatus comprising a driving device configured to drive the object, and a controller configured to perform negative feedback control of the driving device based on information of vibration of the object, wherein the controller is configured to perform positive feedback control of the driving device based on information of a velocity of the object so as to reduce a force which the support causes to act on the object in accordance with the velocity.

22 Claims, 6 Drawing Sheets

(56) References Cited

U.S. PATENT DOCUMENTS

| | | | |
|---|---|---|---|
| 6,286,644 B1* | 9/2001 | Wakui | F16F 15/02 188/378 |
| 6,448,723 B1* | 9/2002 | Wakui | G03F 7/70716 318/135 |
| 2001/0040324 A1* | 11/2001 | Mayama | F16F 15/02 267/136 |
| 2003/0090645 A1* | 5/2003 | Kato | F16F 15/02 355/72 |
| 2003/0147062 A1* | 8/2003 | Morisada | G03F 7/70725 355/72 |
| 2009/0153832 A1* | 6/2009 | Tatsuzaki | G03F 7/709 355/72 |

* cited by examiner

VIBRATION CONTROL APPARATUS, LITHOGRAPHY APPARATUS, AND METHOD OF MANUFACTURING ARTICLE

BACKGROUND OF THE INVENTION

Field of the Invention

The present invention relates to a vibration control apparatus, a lithography apparatus, and a method of manufacturing an article.

Description of the Related Art

In a lithography apparatus for forming a pattern on a substrate, the vibration of the main body of the lithography apparatus caused by the vibration of a base (floor) or the like may deteriorate the overlay precision, the image resolving performance or fidelity of a formed pattern, or the like. To cope with this, the lithography apparatus can use a vibration control apparatus for controlling the vibration of an object such as a surface plate on which the main body is mounted.

Japanese Patent Laid-Open No. 2003-21190 discloses a vibration reduction apparatus which reduces the vibration of an object supported by a base via a support (for example, a gas spring) for passively damping a vibration from the base. The vibration reduction apparatus includes an actuator for driving the object and a sensor for detecting the vibration of the object, and performs negative feedback control of the actuator based on the detection result of the sensor. This can reduce the vibration transferred from the base to the object at the natural frequency of the support.

In the above-described vibration control apparatus, if the damping coefficient of the support is not considered, the performance of controlling the vibration of the object may deteriorate.

SUMMARY OF THE INVENTION

The present invention provides, for example, a vibration control apparatus advantageous in control of vibration of an object.

According to one aspect of the present invention, there is provided a vibration control apparatus which controls vibration of an object supported via a support having a damping coefficient, the apparatus comprising: a driving device configured to drive the object; and a controller configured to perform negative feedback control of the driving device based on information of vibration of the object, wherein the controller is configured to perform positive feedback control of the driving device based on information of a velocity of the object so as to reduce a force which the support causes to act on the object in accordance with the velocity.

Further features of the present invention will become apparent from the following description of exemplary embodiments with reference to the attached drawings.

DESCRIPTION OF THE EMBODIMENTS

Figure 1:
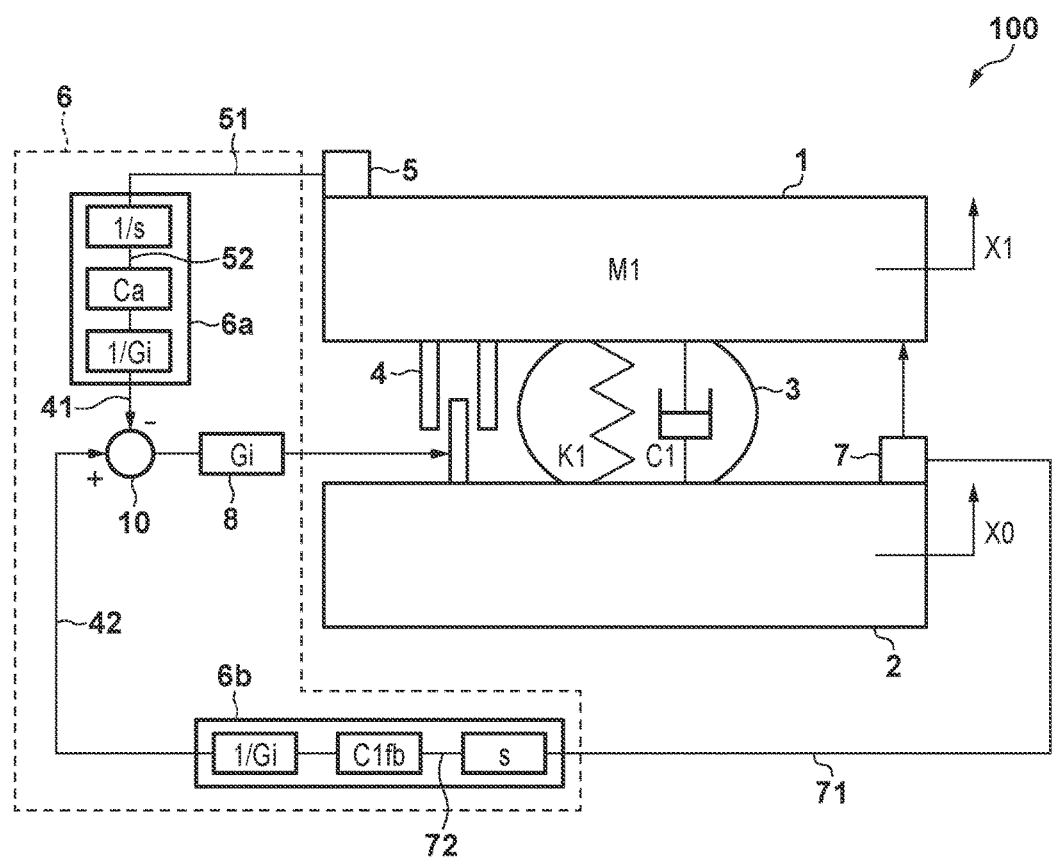
FIG. 1 is a schematic view showing the arrangement of a vibration control apparatus according to the first embodiment.

Exemplary embodiments of the present invention will be described below with reference to the accompanying drawings. Note that the same reference numerals denote the same members throughout the drawings, and a repetitive description thereof will not be given.

<First Embodiment>

A vibration control apparatus 100 according to the first embodiment of the present invention will be described. The vibration control apparatus 100 according to the first embodiment reduces the vibration of an object 1 such as a surface plate supported by a base 2 (floor) via a support 3. The first embodiment will describe the vibration control apparatus 100 which reduces a vibration in the vertical direction (Z direction) of the object 1. Note that the vibration control apparatus 100 can also reduce a vibration in the horizontal direction of the object 1 by applying, to the horizontal direction (X and Y directions), the same arrangement as that of reducing the vibration in the vertical direction of the object 1.

The vibration control apparatus 100 according to the first embodiment is used as, for example, a component of a lithography apparatus for forming a pattern on a substrate. The main body of the lithography apparatus or part (a forming unit for forming the pattern on the substrate) of it can be mounted on the object 1. Examples of the lithography apparatus are an imprint apparatus for molding an imprint material on a substrate using a mold, a drawing apparatus for performing drawing on a substrate using a charged particle beam, and a projection exposure apparatus for projecting the pattern of a mask onto a substrate.

FIG. 1 is a schematic view showing the arrangement of the vibration control apparatus 100 according to the first embodiment. The vibration control apparatus 100 can include, for example, the object 1 for which a vibration is to be reduced, the support 3, and the base 2 which supports the object 1 via the support 3. The support 3 has a function (feature) of passively damping a vibration transferred from the base 2 to the object 1 (for example, the support 3 can include a gas spring). That is, the support 3 can have a damping coefficient. Furthermore, the vibration control apparatus 100 can include a driving device 4 for driving the object 1 so as to change the relative position between the base 2 and the object 1, a detector 5 (second detector) for detecting the vibration of the object 1, and a controller 6. For example, a linear motor, an air actuator, or the like can be used as the driving device 4. For example, a servo accelerometer for detecting the acceleration of the object 1 or the like can be used as the detector 5.

The controller 6 performs negative feedback control of the driving device 4 based on the vibration information of the object 1 so as to reduce the vibration of the object 1. For example, the controller 6 can include a compensator 6a which determines, based on a feedback gain Ca (second gain) and the information (velocity information 52) of the velocity of the object 1 as the information of the vibration of the object 1, a command value 41 (second command value) for causing the driving device 4 to drive the object 1. The compensator 6a obtains the velocity information 52 of the object 1 as the information of the vibration of the object 1 by, for example, integrating a signal 51 (the acceleration of the object 1 detected by the detector 5) from the detector 5. The compensator 6a then determines the command value 41 of the driving device 4 by multiplying the obtained velocity information 52 by the feedback gain Ca, and dividing the resultant value by a current driver gain Gi. The thus determined command value 41 is amplified by the current driver gain Gi in a multiplier 8, and supplied to the driving device 4 as a manipulated variable.

When determining the command value 41 in the compensator 6a, for example, the deviation (the error) between the velocity (velocity information 52) of the object 1 and the target velocity of the object 1 may be used. Since the vibration control apparatus 100 according to the first embodiment sets the target velocity of the object 1 to "zero", FIG. 1 does not illustrate an arrangement of obtaining the deviation. The feedback gain Ca is a transfer function which receives the velocity information 52 of the object 1 and outputs a value obtained by multiplying the command value 41 by the current driver gain Gi.

Figure 2:
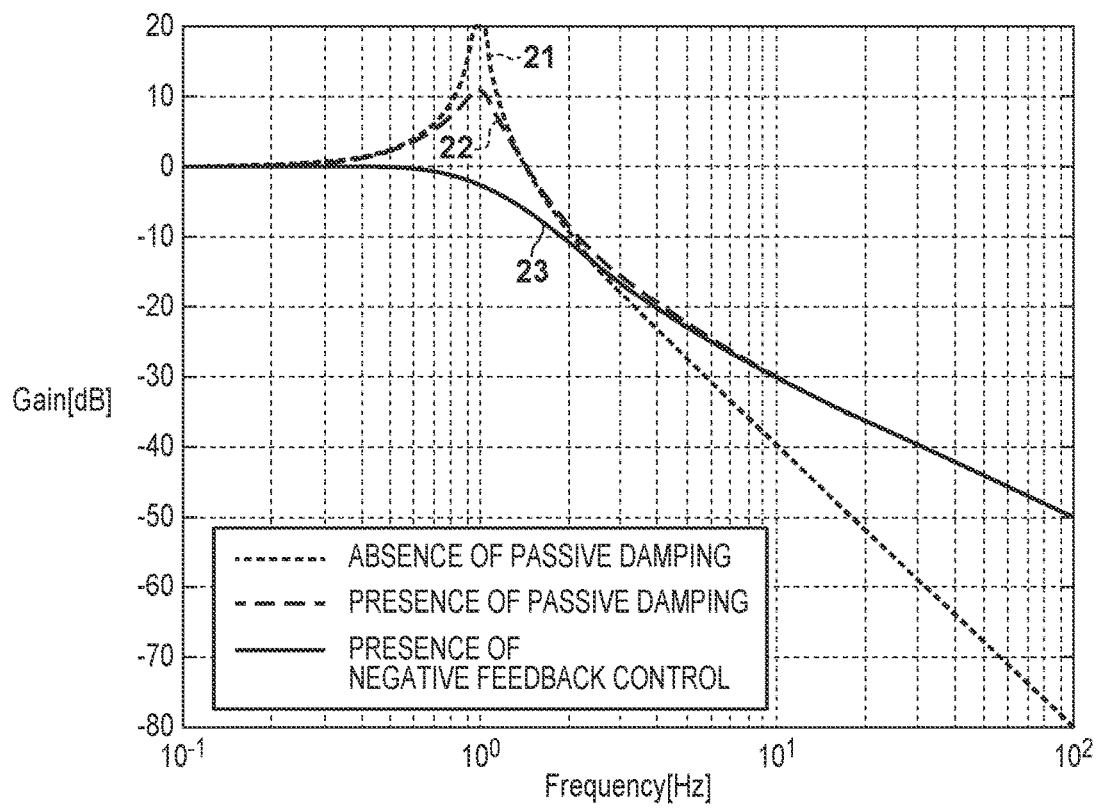
FIG. 2 is a graph showing a vibration transfer characteristic from a base to an object.

A vibration transfer characteristic from the base 2 to the object 1 will be described with reference to FIG. 2. FIG. 2 is a graph showing the vibration transfer characteristic (simulation result) from the base 2 to the object 1, in which the abscissa represents the frequency and the ordinate represents a vibration transfer rate (gain) from the base 2 to the object 1. A broken line 21 shown in FIG. 2 indicates the vibration transfer characteristic in a state in which the support 3 does not passively damp the vibration. A broken line 22 shown in FIG. 2 indicates the vibration transfer characteristic in a state in which the support 3 passively damps the vibration. A solid line 23 shown in FIG. 2 indicates the vibration transfer characteristic in a state in which the support 3 passively damps the vibration and the controller 6 performs negative feedback control of the driving device 4.

Referring to FIG. 2, in the state (broken line 22) in which the support 3 passively damps the vibration, the vibration transfer rate (gain) at the natural frequency of the support 3 can be reduced, as compared with the state (broken line 21) in which the support 3 does not passively damp the vibration. However, the vibration transfer rate on the high frequency side is higher than that at the natural frequency. This means that under the influence of the passive damping by the support 3 (a damping coefficient C1 of the support 3), as the damping coefficient C1 of the support 3 is larger, the vibration transfer rate on the high frequency side increases. If the controller 6 performs negative feedback control of the driving device 4, the vibration transfer rate at the natural frequency of the support 3 is further reduced but the vibration transfer rate on the high frequency side is not improved, as indicated by the solid line 23 in FIG. 2.

Figure 3:
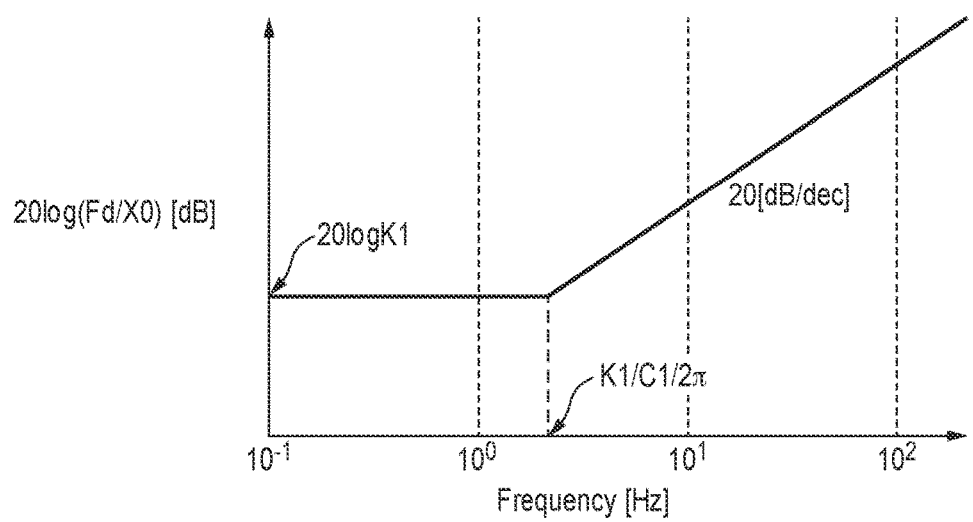
FIG. 3 is a graph showing the Bode diagram of a transfer function from a displacement X0 of the base to a disturbance Fd.

The reason why the vibration transfer rate on the high frequency side increases will be explained. A disturbance (a force disturbance) Fd transferred from the base 2 to the object 1 via the support 3 is given by:

$$Fd = (C1 \cdot s + K1) \cdot X0 = K1 \cdot \left(1 + \frac{s}{K1/C1}\right) \cdot X0 \quad (1)$$

where K1 represents the spring constant (rigidity (stiffness)) of the support 3, C1 represents the damping coefficient of the support 3, and X0 represents the displacement of the base 2. FIG. 3 shows the Bode diagram of a transfer function from the displacement X0 of the base 2 to the disturbance Fd.

Referring to equation (1) and FIG. 3, it is understood that the disturbance Fd occurring due to the displacement X0 of the base 2 increases with a gradient of 20 [dB/dec] on a frequency side higher than K1/C1/2π [Hz] under the influence of the damping coefficient C1 of the support 3. This indicates that a force proportional to the velocity of the base 2 is transferred to the object 1 via the support 3 on the high frequency side.

To cope with this, the vibration control apparatus 100 (controller 6) according to the first embodiment performs, based on the information of the velocity of the object 1, positive feedback control of the driving device 4 so as to reduce the force of the support 3 exerted on the object 1 by the velocity of the object 1. More specifically, the vibration control apparatus 100 performs positive feedback control of the driving device 4 based on the information of the relative velocity between the base 2 and the object 1 so as to reduce the force proportional to the velocity of the base 2, which is transferred to the object 1. For example, the vibration control apparatus 100 can be provided with a detector 7 (first detector) for detecting the relative position between the base 2 and the object 1, as shown in FIG. 1. The controller 6 can include a compensator 6b which determines, based on the detection result of the detector 7 and a feedback gain C1fb (first gain), a command value 42 (first command value) for causing the driving device 4 to drive the object 1.

The compensator 6b obtains the information of the velocity of the object 1, that is, the information (relative velocity information 72) of the relative velocity between the base 2 and the object 1 by, for example, differentiating a signal 71 (the relative position between the base 2 and the object 1) from the detector 7. The compensator 6b then determines the command value 42 of the driving device 4 by multiplying the obtained relative velocity information 72 by the feedback gain C1fb, and dividing the resultant value by the current driver gain Gi. The thus determined command value 42 is added by an adder 10 to the command value 41 determined by the compensator 6a, and is then amplified by the current driver gain Gi in the multiplier 8 and supplied to the driving device 4 as a manipulated variable. Note that the positive feedback control has a gain based on the damping coefficient C1 of the support 3. More specifically, the feedback gain C1fb in the compensator 6b is set to a value equal to or smaller than the damping coefficient C1 of the support 3. Note that the compensator 6b may include a low-pass filter for reducing noise components (high frequency noise) in a signal obtained by differentiating the signal 71 (the relative position between the base 2 and the object 1) from the detector 7.

When determining the command value 42 in the compensator 6b, for example, the deviation between a target relative velocity and the relative velocity (relative velocity information 72) of the base 2 and object 1 may be used. Since the vibration control apparatus 100 according to the first embodiment sets the target relative velocity to "zero", FIG. 1 does not illustrate an arrangement of obtaining the deviation. The feedback gain C1fb is a transfer function which receives the relative velocity information 72 and outputs a value obtained by multiplying the command value 42 by the current driver gain Gi.

Figure 4:
FIG. 4 is a block diagram showing vibration transfer from the displacement X0 of the base to a displacement X1 of the object.

FIG. 4 is a block diagram showing vibration transfer from the displacement X0 of the base 2 to a displacement X1 of the object 1 when the controller 6 performs positive feedback control of the driving device 4. As shown in FIG. 4, if the feedback gain C1fb of the compensator 6b is set to a value almost equal to the damping coefficient C1 of the support 3 (C1 ≈C1fb), a force proportional to the velocity of the base 2 can be reduced (canceled) by the positive feedback control of the driving device 4 by the controller 6.

Figure 5:
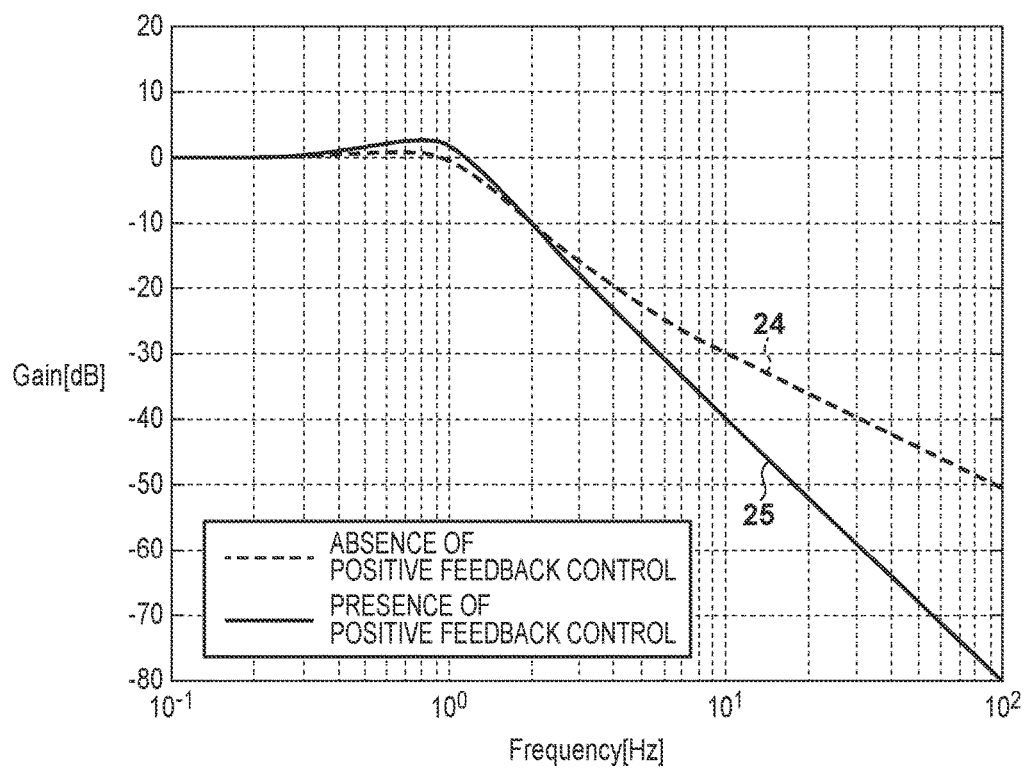
FIG. 5 is a graph showing a vibration transfer characteristic from the base to the object.

FIG. 5 is a graph showing a vibration transfer characteristic from the base 2 to the object 1, in which the abscissa represents the frequency and the ordinate represents the vibration transfer rate (gain). A broken line 24 shown in FIG. 5 indicates the vibration transfer characteristic in a state in which the controller 6 does not perform positive feedback control of the driving device 4, and a solid line 25 shown in FIG. 5 indicates the vibration transfer characteristic in a state in which the controller 6 performs positive feedback control of the driving device 4. Referring to FIG. 5, it is understood that when the controller 6 performs positive feedback control of the driving device 4, the vibration transfer rate on the high frequency side is reduced.

As described above, the vibration control apparatus 100 according to the first embodiment determines the command value 42 based on the feedback gain C1fb and the relative velocity information 72 between the base 2 and the object 1, and performs positive feedback control of the driving device 4 based on the determined command value 42. Note that the feedback gain C1fb is set to a value equal to or smaller than the damping coefficient of the support 3. This can reduce the vibration transfer rate on the high frequency side. When the object 1 vibrates at a low frequency, this may deteriorate the overlay precision of the lithography apparatus. The vibration control apparatus 100 according to the first embodiment obtains the relative velocity information 72 between the base 2 and the object 1 by performing first-order differentiation of the signal 71 (the relative displacement between the base 2 and the object 1) from the detector 7. In this case, amplification by a differential operation (a differentiating operation) is suppressed with respect to low frequency noise included in the signal 71 from the detector 7, and thus it is possible to suppress the object 1 from vibrating at a low frequency.

<Second Embodiment>

Figure 6:
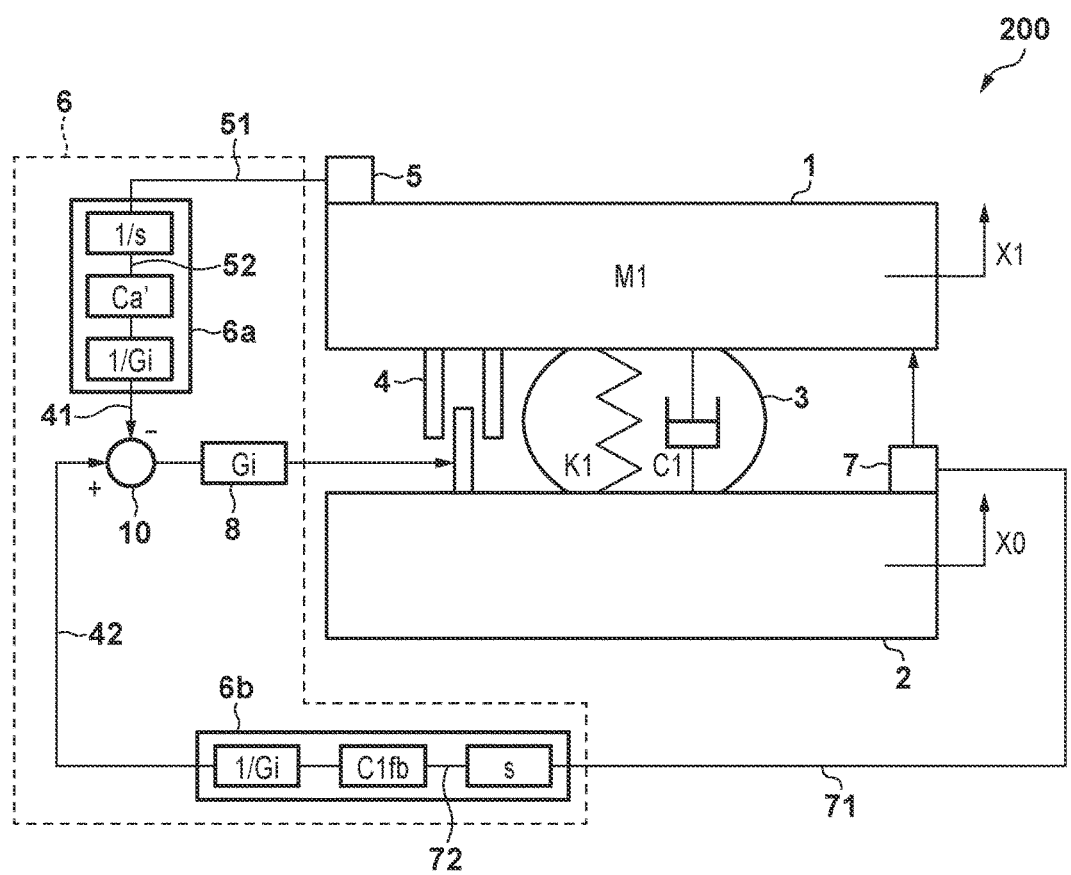
FIG. 6 is a schematic view showing the arrangement of a vibration control apparatus according to the second embodiment.

If positive feedback control of the driving device 4 is performed using the compensator 6b, it is possible to reduce the vibration transfer rate on the high frequency side but the vibration transfer rate at the natural frequency of the support 3 unwantedly increases, as shown in FIG. 5. This is because passive damping of the vibration in the support 3 is reduced by the positive feedback control of the driving device 4 using the compensator 6b. To solve this problem, a vibration control apparatus 200 according to the second embodiment is configured so that negative feedback control of a driving device 4 using a compensator 6a has a gain based on the damping coefficient of a support 3. More specifically, a feedback gain Ca' of the compensator 6a is set based on a feedback gain C1fb of a compensator 6b so as to reduce a vibration transferred from a base 2 to an object 1 at the natural frequency of the support 3. FIG. 6 is a schematic view showing the arrangement of the vibration control apparatus 200 according to the second embodiment. In the vibration control apparatus 200 according to the second embodiment, the feedback gain Ca' (second gain) of the compensator 6a is set to a value given by:

$$Ca' \geq Ca + C1fb \quad (2)$$

Figure 7:
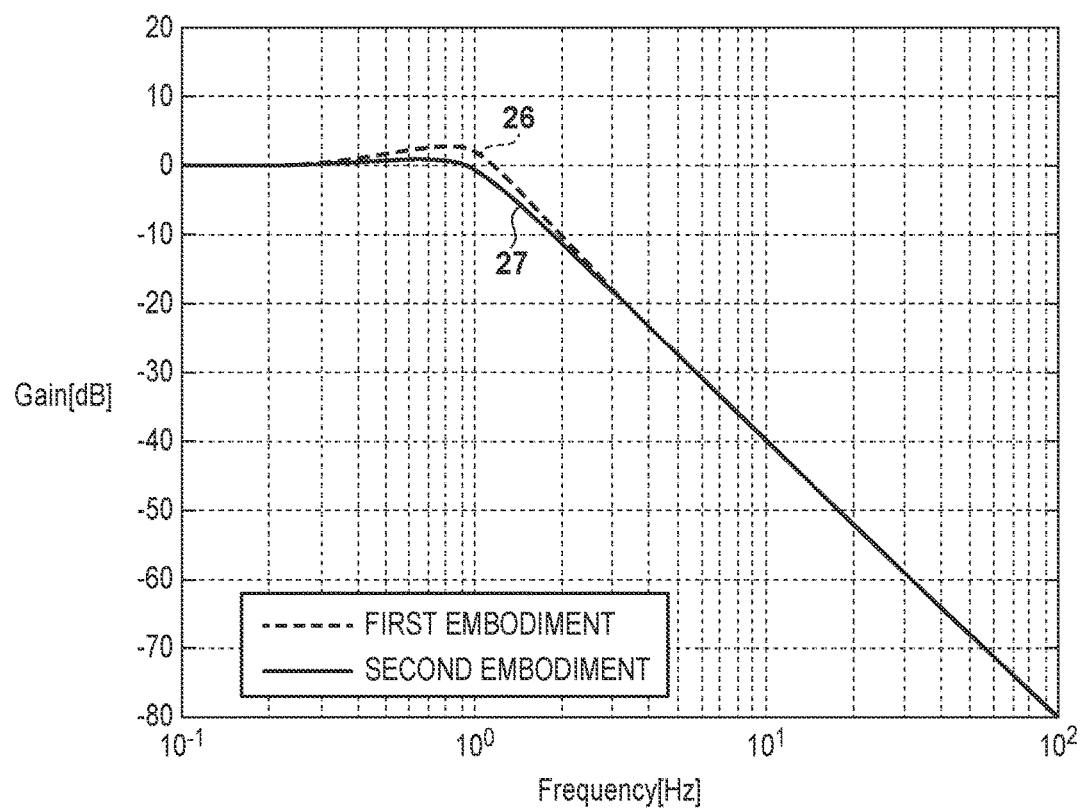
FIG. 7 is a graph showing a vibration transfer characteristic from a base to an object.

As described above, the feedback gain Ca' of the compensator 6a according to the second embodiment is set to a value equal to or larger than that obtained by adding the feedback gain C1fb of the compensator 6b to the feedback gain Ca of the compensator 6a according to the first embodiment. This can decrease the vibration transfer rate at the natural frequency of the support 3, as shown in FIG. 7. FIG. 7 is a graph showing vibration transfer characteristics respectively from the bases 2 to the objects 1 in the vibration control apparatuses according to the first and second embodiments. A broken line 26 shown in FIG. 7 indicates the vibration transfer characteristic in the vibration control apparatus 100 according to the first embodiment, and a solid line 27 shown in FIG. 7 indicates the vibration transfer characteristic in the vibration control apparatus 200 according to the second embodiment. In the vibration control apparatus 200 according to the second embodiment, before the start of the positive feedback control of the driving device 4 using the compensator 6b, the feedback gain of the compensator 6a may be changed from Ca to Ca'.

<Third Embodiment>

A vibration control apparatus 300 according to the third embodiment will be described with reference to FIG. 8. As described above, since the vibration control apparatus 100 according to the first embodiment obtains the relative velocity information 72 between the base 2 and the object 1 by performing first-order differentiation of the signal 71 from the detector 7, it is possible to suppress the influence of the low frequency noise included in the signal 71 from the detector 7. Since, however, the vibration control apparatus 100 according to the first embodiment is influenced by the high frequency noise included in the signal 71 from the detector 7, the vibration reduction characteristic on the high frequency side may be further improved. Therefore, the vibration control apparatus 300 (a controller 6) according to the third embodiment performs negative feedforward control of a driving device 4 based on the information (velocity information 92) of the velocity of a base 2.

Figure 8:
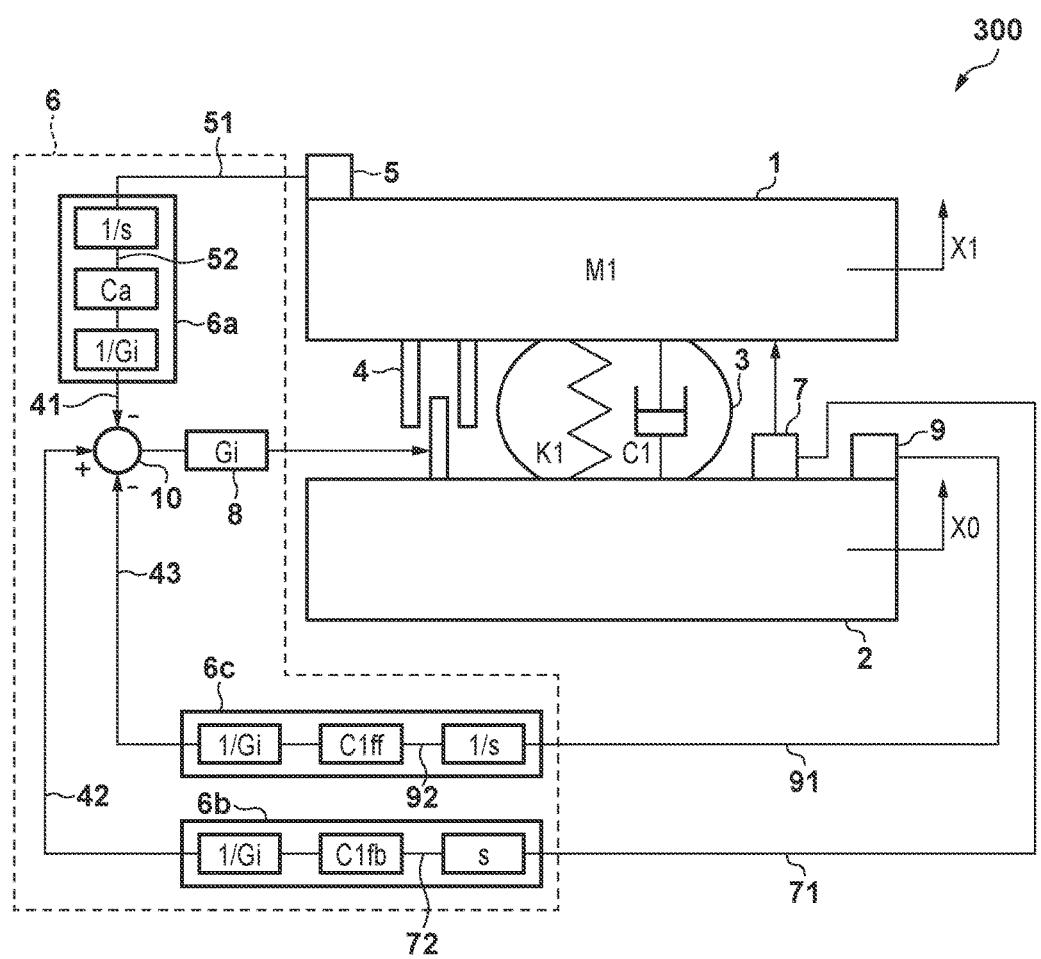
FIG. 8 is a schematic view showing the arrangement of a vibration control apparatus according to the third embodiment.

FIG. 8 is a schematic view showing the vibration control apparatus 300 according to the third embodiment. The vibration control apparatus 300 can be provided with, for example, a third detector 9 for detecting the acceleration of the base 2. The controller 6 can include a compensator 6c which determines, based on the detection result of the third detector 9 and a feedforward gain Caff (third gain), a third command value 43 for causing the driving device 4 to drive an object 1. The compensator 6c obtains the velocity information 92 of the base 2 by, for example, integrating a signal 91 (the acceleration of the base 2) from the third detector 9. The compensator 6c then determines the third command value 43 of the driving device 4 by multiplying the obtained velocity information 92 by a feedforward gain C1ff, and dividing the resultant value by a current driver gain Gi. The thus determined third command value 43 is added by an adder 10 to a command value 41 determined by a compensator 6a and a command value 42 determined by a compensator 6b, and is then amplified by the current driver gain Gi in a multiplier 8 and supplied to the driving device 4 as a manipulated variable.

When determining the third command value 43 in the compensator 6c, for example, the deviation between the velocity (velocity information 92) of the base 2 and the target velocity of the base 2 may be used. Since the vibration control apparatus 300 according to the third embodiment sets the target velocity of the base 2 to "zero", FIG. 8 does not illustrate an arrangement of obtaining the deviation. The feedforward gain C1ff is a transfer function which receives the velocity information 92 of the base 2 and outputs a value obtained by multiplying the third command value 43 by the current driver gain Gi.

As described above, the vibration control apparatus 300 according to the third embodiment obtains the velocity information 92 of the base 2 by performing first-order integration of the signal 91 from the third detector 9. Consequently, it is possible to suppress the influence of high frequency noise included in the signal 91 from the third detector 9, and improve the vibration reduction characteristic on the high frequency side. Note that a third controller 12 may include a high-pass filter for reducing noise components (low frequency noise) in a signal obtained by integrating the signal 91 (the acceleration of the base 2) from the third detector 9.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on a substrate by using a lithography apparatus (exposure apparatus, imprint apparatus, drawing apparatus, or the like) including the aforementioned vibration control apparatus, and a step of processing the substrate on which the pattern has been formed in the above step. The manufacturing method further includes other well-known steps (for example, oxidation, deposition, vapor deposition, doping, planarization, etching, resist removal, dicing, bonding, and packaging).

<Other Embodiments>

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-200471 filed on Oct. 8, 2015, which is hereby incorporated by reference herein in its entirety.

What is claimed is:

1. A vibration control apparatus for controlling vibration of an object, the apparatus comprising:
a support member configured to contact a base and the object and support the object, the support member having a damping coefficient to passively damp vibration transferring from the base to the object;
a driving device configured to drive the object to change a relative position between the object and the base; and
a controller configured to perform:
negative feedback control of the driving device based on a command value obtained from information on vibration of the object; and
positive feedback control of the driving device based on a command value obtained by multiplying information on a relative velocity between the object and the base by a feedback gain, which is set to a value equal to or smaller than the damping coefficient of the support member.

2. The apparatus according to claim 1, further comprising:
a first detector configured to detect a relative position between the object and the base,
wherein the controller is configured to obtain the information on the relative velocity by differentiating the relative position detected by the first detector.

3. The apparatus according to claim 2, wherein the controller includes a low-pass filter for reducing a noise component in a signal obtained by differentiating the relative position detected by the first detector.

4. The apparatus according to claim 1, further comprising:
a second detector configured to detect an acceleration of the object,
wherein the controller is configured to obtain the information on the vibration of the object by integrating the acceleration detected by the second detector.

5. The apparatus according to claim 1, wherein the positive feedback control has a gain based on the damping coefficient.

6. The apparatus according to claim 5, wherein the negative feedback control has a gain based on the damping coefficient.

7. The apparatus according to claim 1, wherein the controller is configured to perform a feedforward control of the driving device based on a command value obtained from information on a velocity of the base.

8. The apparatus according to claim 7, further comprising:
a third detector configured to detect an acceleration of the base,
wherein the controller is configured to obtain the information on the velocity of the base by integrating the acceleration of the base detected by the third detector.

9. The apparatus according to claim 8, wherein the controller includes a high-pass filter configured to reduce a noise component in a signal obtained by integrating the acceleration detected by the third detector.

10. The apparatus according to claim 1, wherein the support member includes a gas spring.

11. The apparatus according to claim 1, wherein the controller is configured to perform the negative feedback control of the driving device based on a command value obtained by multiplying the information on vibration of the object by a second feedback gain.

12. The apparatus according to claim 11, wherein the second feedback gain is set based on the feedback gain, to reduce vibration transferring from the base to the object at a natural frequency of a system including the object and the support member.

13. The apparatus according to claim 12, wherein the second feedback gain is set to a value larger than the feedback gain.

14. The apparatus according to claim 1, wherein the support member is arranged between the object and the base.

15. The apparatus according to claim 1, wherein the controller is configured to perform:
the negative feedback control based on the information on vibration of the object to reduce vibration transferring from the base to the object at a natural frequency of a system including the object and the support member; and
the positive feedback control based on the information on the relative velocity between the object and the base to reduce vibration transferring from the base to the object at a higher frequency than the natural frequency.

16. The apparatus according to claim 1, wherein the controller is configured to perform the positive feedback control based on information on a velocity of the object, as the information on vibration of the object.

17. The apparatus according to claim 1, wherein the controller is configured to perform the negative feedback control and the positive feedback control for compensating a velocity of the object.

18. The apparatus according to claim 1, wherein each of the negative feedback control and the positive feedback control is velocity feedback control.

19. The apparatus according to claim 1, wherein the driving device is arranged between the object and the base, and is configured to change a gap between the object and the base, as the relative position.

20. The apparatus according to claim 1, wherein on the object, a lithography apparatus configured to perform patterning on a substrate is mounted.

21. A lithography apparatus comprising:
a patterning device configured to perform patterning on a substrate; and
a vibration control apparatus configured to control vibration of an object on which the patterning device is mounted,
wherein the vibration control apparatus includes:
a support member configured to contact a base and the object and support the object, the support member having a damping coefficient to passively damp vibration transferring from the base to the object;
a driving device configured to drive the patterning device to change a relative position between the patterning device and the base; and
a controller configured to perform:
negative feedback control of the driving device based on a command value obtained from information on vibration of the object; and
positive feedback control of the driving device based on a command value obtained by multiplying information on a relative velocity between the object and the base by a feedback gain, which is set to a value equal to or smaller than the damping coefficient of the support member.

22. A method of manufacturing an article, the method comprising steps of:
performing patterning on a substrate using a lithography apparatus; and
processing the substrate, on which the patterning has been performed, to manufacture the article,
wherein the lithography apparatus includes:
a patterning device configured to perform patterning on a substrate; and
a vibration control apparatus configured to control vibration of an object on which the patterning device is mounted,
wherein the vibration control apparatus includes:
a support member configured to contact a base and the object and support the object, the support member having a damping coefficient to passively damp vibration transferring from the base to the object;
a driving device configured to drive the patterning device to change a relative position between the patterning device and the base; and
a controller configured to perform:
negative feedback control of the driving device based on a command value obtained from information vibration of the object; and
positive feedback control of the driving device based on a command value obtained by multiplying information on a relative velocity between the object and the base by a feedback gain, which is set to a value equal to or smaller than the damping coefficient of the support member.

* * * * *